United States Patent [19]

Asakawa et al.

[11] Patent Number: 5,565,697
[45] Date of Patent: *Oct. 15, 1996

[54] SEMICONDUCTOR STRUCTURE HAVING ISLAND FORMING GROOVES

[75] Inventors: Toshifumi Asakawa, Yamato; Daisuke Kosaka, Takarazuka; Haruo Nakayama, Kawanishi, all of Japan

[73] Assignee: Ricoh Company, Ltd., Tokyo, Japan

[ * ] Notice: The term of this patent shall not extend beyond the expiration date of Pat. No. 5,073,815.

[21] Appl. No.: 458,800

[22] Filed: Jun. 2, 1995

Related U.S. Application Data

[62] Division of Ser. No. 341,265, Nov. 17, 1994, Pat. No. 5,459,346, which is a continuation of Ser. No. 970,126, Nov. 2, 1992, abandoned, which is a division of Ser. No. 715,717, Jun. 13, 1991, Pat. No. 5,173,446, which is a continuation of Ser. No. 371,543, Jun. 26, 1989, abandoned.

[30] Foreign Application Priority Data

| Jun. 28, 1988 | [JP] | Japan | 63-162117 |
| Jun. 29, 1988 | [JP] | Japan | 63-162925 |
| Jul. 9, 1988 | [JP] | Japan | 63-171326 |
| Aug. 9, 1988 | [JP] | Japan | 63-199146 |
| Mar. 23, 1989 | [JP] | Japan | 1-72356 |

[51] Int. Cl.⁶ .......................... H01L 21/782; H01L 27/12; H01L 29/06
[52] U.S. Cl. .......................... 257/347; 257/508; 257/520; 257/768; 257/774
[58] Field of Search .......................... 257/347, 348, 257/353, 501–508, 510, 513, 517, 518, 520, 521, 754–757, 768–770, 774

[56] References Cited

U.S. PATENT DOCUMENTS

| 3,614,558 | 10/1971 | Le Can et al. ........ 317/235 R |
| 3,771,026 | 11/1973 | Asai et al. ........ 317/234 R |
| 3,941,647 | 3/1976 | Druminski ........ 156/612 |
| 3,961,997 | 6/1976 | Chu ........ 148/174 |
| 3,996,095 | 12/1976 | Ahn et al. ........ 156/610 |
| 4,059,461 | 11/1977 | Fan et al. ........ 148/1.5 |
| 4,091,169 | 5/1978 | Bohg et al. ........ 428/428 |
| 4,180,618 | 12/1979 | Alpha et al. ........ 428/428 |
| 4,292,091 | 9/1981 | Togei ........ 437/173 |
| 4,292,730 | 10/1981 | Ports ........ 257/538 |
| 4,396,456 | 8/1983 | Cook ........ 156/602 |
| 4,415,383 | 11/1983 | Naem et al. ........ 437/174 |
| 4,437,139 | 3/1984 | Howard ........ 361/313 |

(List continued on next page.)

FOREIGN PATENT DOCUMENTS

| 0047140 | 8/1981 | European Pat. Off. ...... H01L 21/268 |
| 0057135 | 8/1982 | European Pat. Off. ...... H01L 27/12 |
| 0078681 | 10/1982 | European Pat. Off. ...... H01L 21/268 |
| 0234529 | 2/1985 | German Dem. Rep. ...... H01L 21/268 |
| 3508469 | 3/1985 | Germany ...... C03C 17/34 |
| 3620300 | 6/1986 | Germany ...... H01L 21/268 |
| 0038057 | 4/1981 | Japan ...... H01L 21/76 |
| 0175721 | 10/1984 | Japan ...... H01L 21/265 |

(List continued on next page.)

OTHER PUBLICATIONS

B–Y. Tsaur, et al., "Stress–enhanced carrier mobility in zone melting recrystallized polycrystalline Si films on $SiO_2$–coated substrates", Appl. Phys. Lett. 40(4), Feb. 15, 1982, pp. 322–324.

S. A. Lyon, et al., "Microstrain in laser–crystallized silicon islands on fused silica", Appl. Phys. Lett. 40(4), Feb. 15, 1982, pp. 316–318.

(List continued on next page.)

Primary Examiner—Peter Toby Brown
Attorney, Agent, or Firm—Cooper & Dunham LLP

[57] ABSTRACT

A semiconductor substrate comprises a foundation, a semiconductor monocrystalline film formed on the foundation, and a high-melting-point metal film or a high-melting-point metal alloy film disposed in at least part of a region between the semiconductor monocrystalline film and the foundation. The high-melting-point metal film disposed below the semiconductor monocrystalline film can be utilized as a conductor in a semiconductor device.

3 Claims, 5 Drawing Sheets

U.S. PATENT DOCUMENTS

| | | | |
|---|---|---|---|
| 4,472,729 | 9/1984 | Shibata et al. | 257/74 |
| 4,523,962 | 6/1985 | Nishimura | 427/53.1 |
| 4,545,823 | 10/1985 | Drowley | 148/1.5 |
| 4,643,950 | 2/1987 | Ogura et al. | 428/446 |
| 4,659,587 | 4/1987 | Imura et al. | 427/53.1 |
| 4,717,681 | 1/1988 | Curran | 257/197 |
| 4,727,047 | 2/1988 | Bozler et al. | 437/89 |
| 4,732,801 | 3/1988 | Joshi | 428/198 |
| 4,752,590 | 6/1988 | Adams et al. | 437/84 |
| 4,794,445 | 12/1988 | Homma et al. | 257/508 |
| 4,795,679 | 1/1989 | Ramesh et al. | 428/428 |
| 4,816,421 | 3/1989 | Dynes et al. | 257/757 |
| 4,819,037 | 4/1989 | Sakakibara et al. | 257/22 |
| 4,822,751 | 4/1989 | Iahizu et al. | 437/173 |
| 4,822,752 | 4/1989 | Sugahara et al. | 437/174 |
| 4,826,785 | 5/1989 | McClure et al. | 437/174 |
| 4,847,157 | 7/1989 | Goodman et al. | 428/426 |
| 4,885,052 | 12/1989 | Fan et al. | 156/620.7 |
| 4,915,772 | 4/1990 | Fehlner et al. | 156/620.7 |
| 4,984,048 | 1/1991 | Sagara et al. | 257/520 |
| 4,990,464 | 2/1991 | Baumgart et al. | 437/83 |
| 5,060,041 | 10/1991 | Haga et al. | 357/30 |
| 5,066,610 | 11/1991 | Chen et al. | 437/83 |
| 5,073,815 | 12/1991 | Kosaka et al. | 257/508 |
| 5,173,446 | 12/1992 | Asakawa et al. | 437/111 |

FOREIGN PATENT DOCUMENTS

| | | | |
|---|---|---|---|
| 0063019 | 4/1986 | Japan | H01L 21/20 |
| 0097964 | 5/1986 | Japan | H01L 27/12 |
| 0102723 | 5/1986 | Japan | H01L 21/20 |
| 0040858 | 8/1987 | Japan | G03G 9/12 |
| 0219510 | 9/1987 | Japan | H01L 21/20 |
| 0286283 | 12/1987 | Japan | H01L 29/78 |
| 0065641 | 3/1988 | Japan | 257/508 |

OTHER PUBLICATIONS

W. G. Hawkins, et al., "Growth of single-crystal silicon islands on bulk fused silica by $CO_2$ laser annealing", Appl. Phys. Lett. 40(4), Feb. 15, 1982, pp. 319–321.

"Hand Book of SDI–Structure Forming Technology", pp. 239–249, (1987).

U.S. patent application Ser. No. 07/763,914 filed Sep. 23, 1991.

U.S. patent application Ser. No. 07/912,894 filed Jul. 13, 1992.

U.S. patent application Ser. No. 08/006,147 filed Jan. 19, 1993.

FIG. 4 CONVENTIONAL
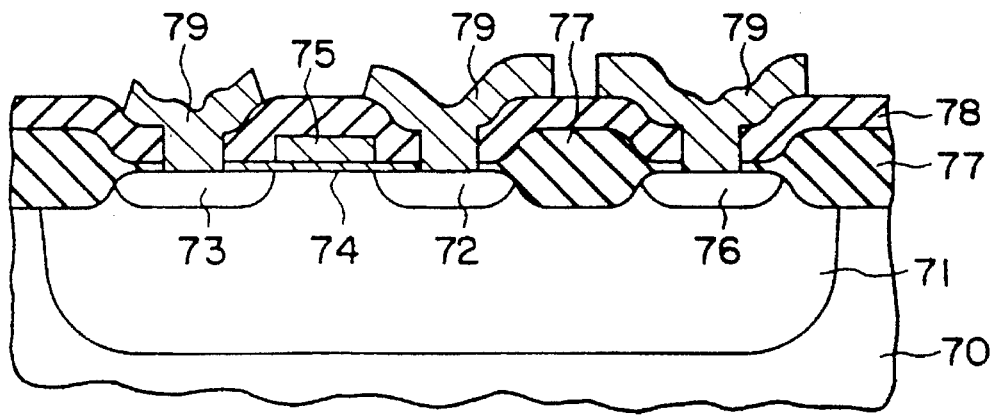

FIG.8 CONVENTIONAL
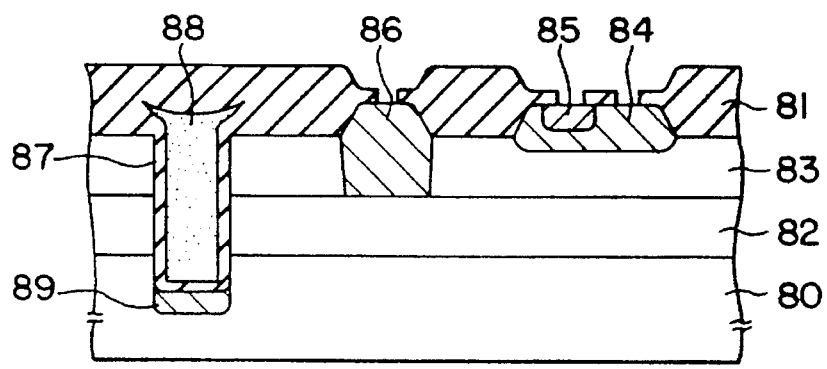

SEMICONDUCTOR STRUCTURE HAVING ISLAND FORMING GROOVES

This application is a division of Ser. No. 08/341,265, filed Nov. 17, 1994, now U.S. Pat. No. 5,459,346; which is a continuation of Ser. No. 07/970,126, filed Nov. 2, 1992 and now abandoned; which is a division of Ser. No. 07/715,717, filed Jun. 13, 1991 and now U.S. Pat. No. 5,173,446; which is a continuation of Ser. No. 07/371,543, filed Jun. 26, 1989 now abandoned.

BACKGROUND OF THE INVENTION

The present invention relates to a semiconductor substrate and a solid state structure which are used in manufacturing semiconductor integrated circuit devices or the like and which has a similar construction to what is generally called SOI (Silicon On Insulator), and to a method of manufacturing the same. The manufacturing method of the present invention relates, in particular, to the method called recrystallization.

The semiconductor substrate of the present invention can be used in various fields such as highly integrated LSIs, high-voltage-resistant devices, radiation resistant devices and three-dimensional integrated circuits.

Even when the material to be grown into monocrystalline semiconductor film consists of a substance other than silicon, e.g. a compound semiconductor such as GaAs, the structure of the obtained monocrystalline semiconductor film is generally called SOI structure. Likewise, also in the present invention, the material to be grown into the monocrystalline semiconductor film is not restricted to silicon.

Those structures which have been proposed up to now as SOI structures comprise semiconductor films grown on dielectric films or dielectric substrates.

As SOI-structure-forming technology, recrystallization, epitaxial growth, insulating-layer burying method, cladding, etc., are available. As for the SOI-Structure-Forming Technology, a general description thereof is set forth with "SOI-Structure-Forming Technology pp 243–247" (published by Sangyo Tosho Kabushiki-Kaisha, 1987).

With respect to recrystallization, there is a method available which is called laser beam recrystallization. According to this method, a polycrystalline or amorphous film formed on a foundation such as an insulating film is melted by the energy of a laser beam, effecting crystal growth while shifting the molten portion.

In order to obtain a monocrystalline film by improving the temperature distribution in the polycrystalline or amorphous film due to the laser beam irradiation, the following attempts have been made:

(a) To improve the temperature distribution within the laser beam spot by using an optical system or a plurality of laser light sources;

(b) To improve the temperature distribution by varying the absorption of the incident laser beam by means of a reflection reducing film or a light absorbing film disposed on the surface of the specimen film; and (c) To improve the temperature distribution by changing the structure of the specimen to thereby vary local heat dissipation.

While these methods allow some single-crystal film to be obtained, it is still desirable to make it possible to efficiently obtain a single-crystal having a large area.

SUMMARY OF THE INVENTION

It is an object of the present invention to provide a semiconductor substrate which is useful for forming various semiconductor devices.

Another object of the present invention is to provide a method which makes it possible to obtain a monocrystalline film having a large area by means of a simple process.

The above objects of the present invention are respectively attained by a semiconductor substrate comprising a foundation, a semiconductor monocrystalline film formed on said foundation, and a high-melting-point metal film or a high-melting-point metal alloy film disposed in at least a part of a region between said semiconductor monocrystalline film and said foundation, and by a method of manufacturing a semiconductor substrate, comprising the steps of: depositing an amorphous semiconductor or a polycrystalline semiconductor film on a foundation covered at least partly with a high-melting-point metal film or a high-melting-point metal alloy film; disposing a cooling medium on said semiconductor film; melting said semiconductor film by irradiating said semiconductor film with energy; and growing a single-crystal while shifting a portion of said semiconductor film irradiated by said energy.

In a substrate in accordance with the present invention, a high-melting-point metal film or a high-melting-point metal alloy film provided below the monocrystalline semiconductor film can be utilized as conductors of making electrical contact with terminals of semiconductor device.

In accordance with the method of the present invention, a monocrystalline film having a large area can be formed by means of recrystallization involving the action of a cooling medium. The energy is then reflected from the high-melting-point metal film or the high-melting-point metal alloy film, so that the foundation is not adversely affected by the heat.

The foundation may be a dielectric body, such as $SiO_2$ or $Si_3N_4$.

The monocrystalline semiconductor film may be made of Si, GaAs, GaP, etc.

The high-melting-point metal film may comprise a film of W, Ti, Mo, Pt, or the like. It may comprise a high-melting-point metal alloy film such as respective silicides of W, Ti, Mo, Pt or the like.

The energy to be irradiated may be applied to the amorphous or polycrystalline semiconductor in the form of a laser beam, a light beam other than the laser beam, an electron beam, a heat ray or the like.

The cooling medium is preferably a liquid organic compound which is not vaporized at a relatively high temperature. Such an organic compound may be selected from among those which are generally known as surface active agents, such as polyethylene glycol, polyethylene ether, polyethylene ester and polypropylene oxide.

Irradiation with energy applied to the amorphous or polycrystalline film formed on the foundation in accordance with the invention makes it easier for large single crystal to grow on the foundation due to the action of the cooling medium. The energy applied to the amorphous or polycrystalline film is reflected from the high-melting-point film, which reduces or eliminates thermal effects on the foundation.

BRIEF DESCRIPTION OF THE DRAWINGS

FIG. 4 sectional view showing a conventional semiconductor device;

FIG. 8 is a sectional view showing a conventional semiconductor device of the OST structure;

DESCRIPTION OF THE PREFERRED EMBODIMENTS

Figure 1:
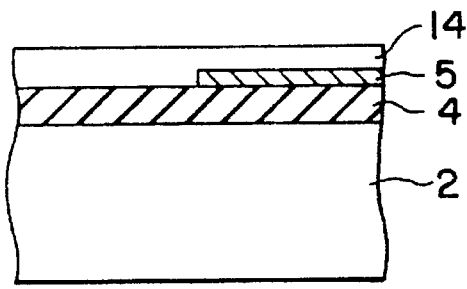
FIGS. 1 and 2 are sectional views showing respective embodiments of a semiconductor substrate according to the present invention.

FIG. 1 shows an embodiment of a semiconductor substrate according to the present invention.

In this embodiment, a silicon oxide film ($SiO_2$) 4 having a thickness of about 1 μm is formed on a monocrystalline silicon substrate 2. Formed on the silicon oxide film is a tungsten film 5 serving as the high-melting-point metal film and having a thickness of about 800 Å. The tungsten film 5 is patterned. A monocrystalline silicon film 14 having a thickness of about 5000 Å is formed on the tungsten film 5.

Figure 2:
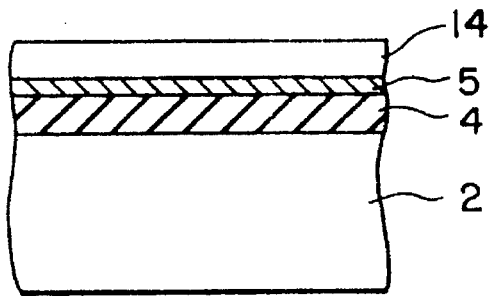

In the embodiment shown in FIG. 2, a tungsten film 5 is formed on the entire surface of a silicon oxide film 4, a monocrystalline silicon film 14 being formed on the tungsten film 5.

Instead of the monocrystalline silicon film 14 shown in FIGS. 1 and 2, a monocrystalline GaAs film may be formed.

FIGS. 3 (A) to 3 (E) illustrate a method of manufacturing the semiconductor substrate shown in FIG. 1 as well as a process for effecting element isolation while using the substrate shown in FIG. 1. FIG. 3 (A): The reference numeral 2 indicates a monocrystalline silicon substrate whose plane orientation is (100). A silicon oxide film 4 having a thickness of about 1 μm is formed by oxidizing the surface of the silicon substrate. A tungsten film 5 serving as the high-melting-point metal film and having a thickness of about 800 Å is deposited on the silicon oxide film 4 by means of sputtering, etc.

The tungsten film 5 is then patterned by means of photomechanical process and etching. A polycrystalline silicon film 6 having a thickness of about 5000 Å is deposited on the thus patterned tungsten film by means of the LPCVD method. A silicon nitride film ($Si_3N_4$) 8 having a thickness of about 800 Å is formed on the polycrystalline silicon film 6 by means of the CVD method. A polyethylene glycol layer 10 serving as the cooling medium is formed on the silicon nitride film 8, and an optical glass plate 12 is disposed on the polyethylene glycol layer so that the thickness of the polyethylene glycol layer may become uniform, whereby the thickness of the polyethylene glycol layer 10 is set to about 2 to 3 mm.

An argon ion laser beam 13 converged by means of a lens is irradiated through the optical glass plate 12 to the polycrystalline silicon film 6. The molten portion 7 of the polycrystalline silicon film 6 is shifted by moving the silicon substrate 2 or the laser beam 13, thereby growing the single crystal 14.

In the case of using a continuous-oscillation argon ion laser, the laser beam irradiation condition is such that its optical output is in the range of several W to 20 W, for example, 3 W, the laser beam diameter on the polycrystalline silicon film 6 is in the range of 20 to 100 μm or so, and the scanning speed of the laser beam is in the range of several cm to 25 cm/sec or so. The polycrystalline silicon film 6 thus grows into a monocrystalline silicon film.

Thereafter, the glass plate 12, the polyethylene glycol layer 10 and the silicon nitride film 8 are removed, and thus a semiconductor substrate is formed.

The process of forming element isolation regions will now be described referring to FIG. 3(B) to FIG. 3(E).

FIG. 3 (B): A silicon oxide film 16 having a thickness of 250 to 500 Å is formed by thermally oxidizing the surface of the monocrystalline silicon film 14. Further, a silicon nitride film ($Si_3N_4$) 18 having a thickness of about 1000 Å is formed on the silicon oxide film 16 by means of the CVD method.

Next, the silicon nitride film 18 is patterned by means of photomechanical process and etching which are the means usually adopted in patterning a silicon nitride film. Wet-etching is performed on those parts of the silicon oxide film 16 which are exposed through the openings of the silicon nitride film 18, until the etched portion reaches to those parts thereof which are beneath the silicon nitride film 18.

Then, etching is performed on the monocrystalline silicon film 14 using an alkali-type anisotropic etchant. This etching progresses obliquely, along the (111) plane. This anisotropic etching is performed until the (111) plane gets laterally below the tips a, b of the eaves of the silicon nitride film 18.

FIG. 3 (C) Next, etching is performed on the monocrystalline silicon film 14 while using the silicon nitride film 18 as a mask, until the etching reaches the silicon oxide film 4. This results in grooves 20 being formed in the monocrystalline silicon film 14.

FIG. 3 (D) Selective oxidation is performed using the silicon nitride film 18 as a mask, thereby forming thick silicon oxide films 22 having a thickness of 0.3 to 1 μm or so in the grooves 20. The surfaces of the grooves 20 are thus covered with silicon oxide films.

Thereafter, the silicon nitride film 18 used as a mask is removed.

FIG. 3 (E) A silicon nitride film 24 having a thickness of about 1000 Å is formed over the entire surface of the silicon oxide film 16 again. This silicon nitride film 24 serves to prevent oxidation from further progressing toward the inside of the monocrystalline silicon film 14 during the subsequent oxidizing process, and to prevent crystal defects from generating in the monocrystalline silicon film 14. If, however, no strict requirements are imposed on the monocrystalline silicon film 14, the formation of this silicon nitride film 24 may be omitted.

Etching of the silicon nitride film 24 is performed in such a manner that the tungsten film 5 is exposed within the grooves 20. Thereafter, polycrystalline silicon 26 is buried in the grooves 20. The resistance of this polycrystalline silicon 26 is lowered by diffusing phosphorous or the like in the polycrystalline silicon 26.

In a substrate in which element isolation is thus effected, the potential of the monocrystalline silicon film 14 in regions which are covered with the tungsten film 5 can be equalized with the potential of the grooves 20. For example, if the monocrystalline silicon film 14 is used as the wells for producing MOS transistors, electrical contact to these wells can be made through the grooves 20. If, for example, bipolar transistors are made on or in the monocrystalline silicon 14, electrical contact to their collectors can be made through the grooves 20.

When no electrical contact is to be made through the grooves 20, the polycrystalline silicon 26 is buried in the grooves 20, and is oxidized to form silicon oxide film on the exposed portion of the polycrystalline silicon. This allows the monocrystalline silicon film 14 to form silicon islands which are completely isolated from the grooves 20 and the silicon oxide film 4 located below the tungsten film 5.

For filling up the grooves 20 for isolation, there may be employed a dielectric material such as $SiO_2$ or $Si_3N_4$, or a polymeric material as well as the polycrystalline silicon 26.

By forming on the thus formed silicon islands elements by means of the normal MOS process or bipolar process, a high-speed device having small junction capacity can be realized.

Figure 3A:
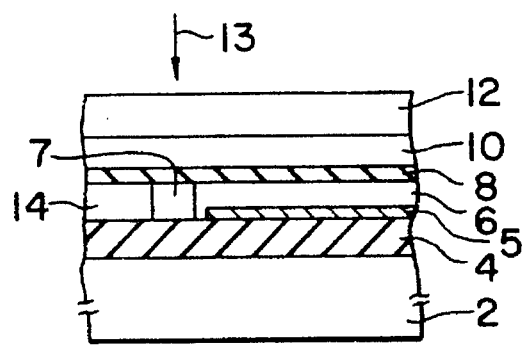
FIGS. 3 (A) to 3 (E) are sectional views illustrating an embodiment of a manufacturing method according to the present invention.
Figure 3B:
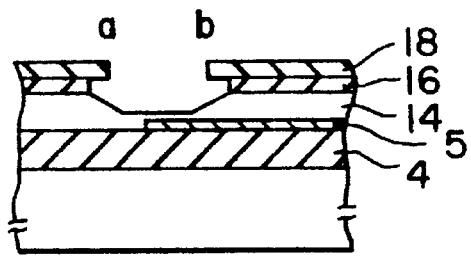
Figure 3C:
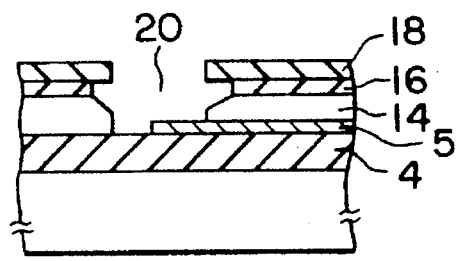
Figure 3D:
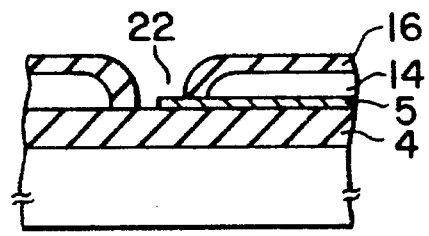
Figure 3E:
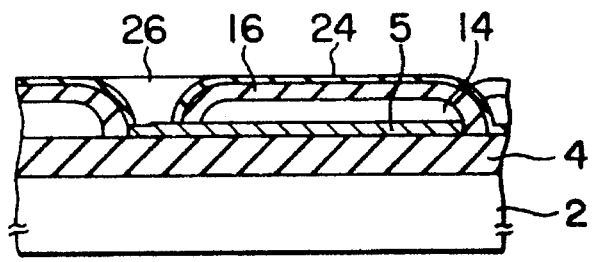

In order that the polyethylene glycol layer 10 shown in FIG. 3(A) can be spread more uniformly, a silicon oxide film having a thickness of about 1000 Å may be formed on the silicon nitride film 8 by means of, for example, the LPCVD method, and then the silicon oxide film thus formed may be covered with the polyethylene glycol layer 10. This is due to the fact that polyethylene glycol 10 tends to wet silicon oxide film better than silicon nitride film.

The optical glass plate 12 is provided for the purpose of making the thickness of the polyethylene glycol layer 10 uniform, and can be omitted.

In the case of producing a semiconductor substrate in which the high-melting-point metal film is formed over the entire surface of silicon oxide film 4 as shown in FIG. 2, the same overall method as described with reference to FIG. 3(A) may be adopted.

Next, the method of forming a monocrystalline GaAs film on a dielectric film will be shown.

Similarly to the case shown in FIG. 3(A), a silicon oxide film 4 having a thickness of about 1 μm is formed on a monocrystalline silicon substrate 2. A GaAs film having a thickness of about 5000 Å is formed on the silicon oxide film 4 by means of evaporation method. Thereafter, a silicon nitride film 8 is formed on the GaAs film. Formed on the silicon nitride film 8 is a polyethylene glycol layer 10 serving as the cooling medium, an optical glass plate 12 being disposed on the polyethylene glycol layer 10. Then, an argon ion laser beam 13 is applied to the GaAs film and scanned, thereby melting the GaAs film and effecting crystal growth.

In accordance with this example, a three-layer solid state structure can be obtained in which a monocrystalline GaAs film is formed on a monocrystalline silicon substrate 2 covered with an insulating film 4. For example, an element is formed on the monocrystalline silicon substrate which constitutes the lowermost layer by means of the usual MOS process or bipolar process and an optical device such as a light emitting diode or a laser diode is formed on the monocrystalline GaAs film which constitutes the uppermost layer, whereby an electronic device can be realized in which an I/O device is integrated with a peripheral circuit.

While it is difficult at present to realize a GaAs single-crystal having a large diameter, this method makes it possible to form a monocrystalline GaAs on a monocrystalline silicon substrate having a large diameter.

While, in this embodiment, a laser beam recrystallization is shown as the manufacturing method, the present invention can be applied in the same manner as in the above to cases where other types of energy such as an electron beam are employed.

In a semiconductor integrated circuit device, such as a solid state structure, MOS transistors, for example, are formed on a semiconductor substrate, such as a monocrystalline silicon substrate. Electrical contact are normally provided on the surface of the substrate on which the semiconductor elements are formed.

FIG. 4 shows, by way of example, a conventional MOS transistor structure formed by means of the LSI process.

The reference numeral 70 indicates an N-type monocrystalline silicon substrate on which a P-well 71 is formed. A source 72 and a drain 73 are formed in the P-well 71 by virtue of an $N^+$ diffusion region, and a gate electrode 75 is formed in the channel region through a gate oxide film 74.

On the other hand, a $P^+$ diffusion region 76 which is of the same conductivity type as the well 71 is formed to provide electrical contact to the well 71. The reference numeral 77 indicates a field oxide film for element isolation. A field oxide film 77 for element isolation is also disposed between the MOS transistor and the diffusion region 76. The technical term "field" means an elements separating area excluding an active area (a transistor area). The reference numerals 78 and 79 indicate an inter-layer insulating film and a wiring of Al, an Al-Si alloy or the like.

In the case of a semiconductor device whose conductivity type is reverse to that shown in FIG. 4, that is, in a semiconductor device which includes a P-type substrate 70, an N-type well 71, a $P^+$-type source 72, a $P^+$-type drain 73, and an $N^+$-type diffusion region, a field oxide film 77 for element isolation is provided likewise.

Since a semiconductor device of this type requires an element isolation region 77 between the diffusion region 76 and the semiconductor elements, the well contact portion occupies a large area, which reduces the degree of integration of the semiconductor device.

Besides, the diffusion region 76 for contacting the well has to be taken into consideration in the case of designing the circuits, which can present design impediments.

Moreover, the N-well is connected to Vcc (5 V), and the P-well or P-substrate is connected to Vss (0 V). In the case of a semiconductor integrated circuit on which a logic circuit and a memory circuit are mounted together, the characteristic of either the logic circuit or the memory circuit is impaired to some extent.

Figure 5:
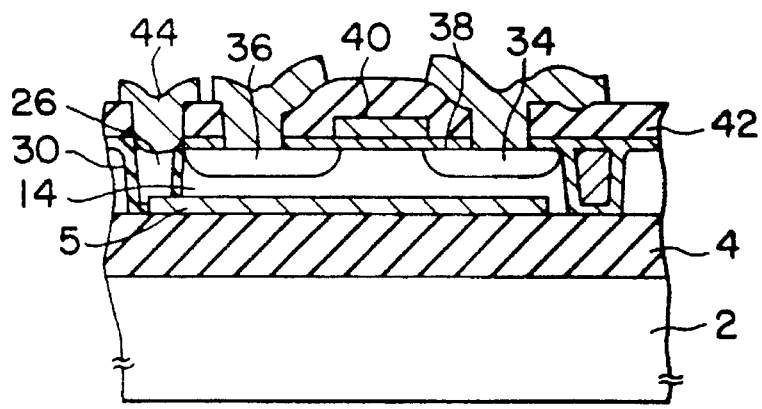
FIG. 5 is a sectional view showing one embodiment of a semiconductor device to which the present invention is applied.
Figure 6:
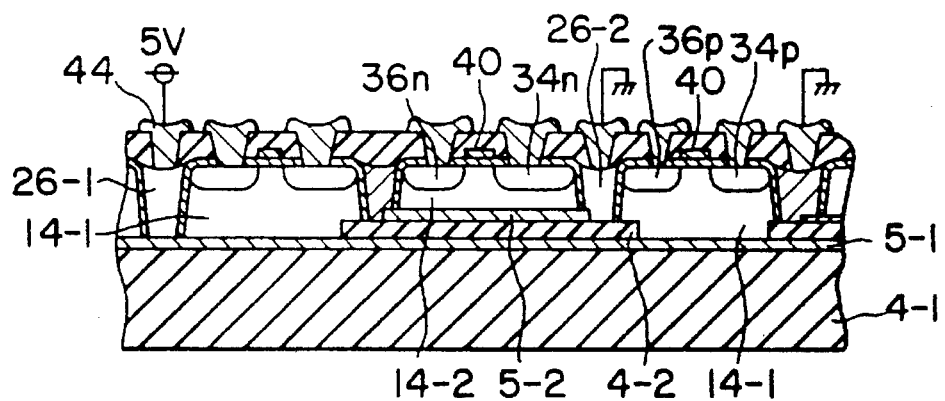
FIGS. 6 and 7 are sectional views showing the other embodiments of the semiconductor device to which the present invention is applied.
Figure 7:
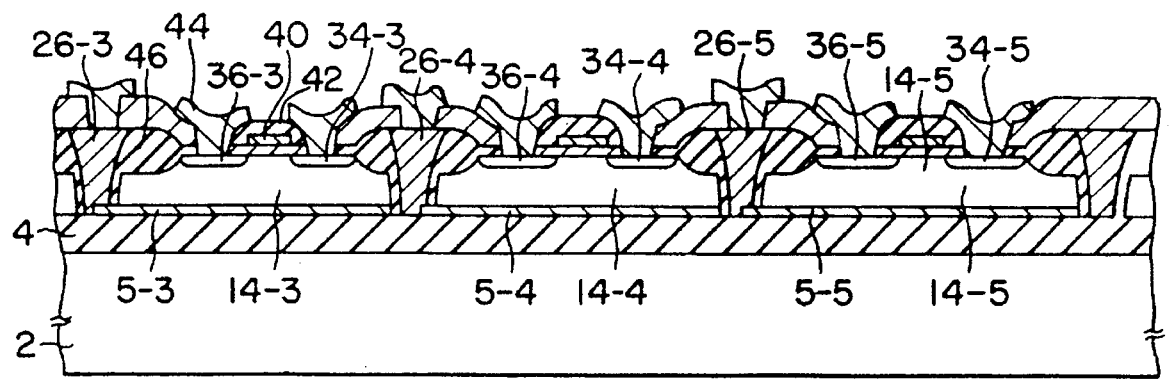

FIGS. 5 to 7 show embodiments of semiconductor devices such as a solid state structure realized by the use of the semiconductor substrate according to the present invention. Such semiconductor devices are improved in the degree of circuit integration, have circuit constitution simplified to facilitate circuit design, and exhibit a high degree of freedom with respect to the potential of the well or the substrate.

In the semiconductor devices shown in FIGS. 5 to 7, a monocrystalline silicon film is formed on an insulating foundation covered at least partly with a high-melting-point metal film or a high-melting-point metal alloy film, the monocrystalline silicon film being isolated by a groove having side walls made of dielectric films, thereby forming a well. Formed in the well is a semiconductor element, the above-mentioned high-melting-point metal film or high-melting-point metal alloy film of the well extending into the isolating groove. A conductor is buried in the groove to permit electrical contact to the well. The insulating foundation may comprise, for example, a monocrystalline silicon substrate on which a film of dielectric material such as $SiO_2$ or $Si_3N_4$ is formed, or may comprise a dielectric plate. The high-melting-point metal may be W, Ti, Mo, Pt, etc., and the high-melting-point metal alloy the silicide of one of the above, for example. The conductor to be buried in the groove may be a substance which is capable of coming into ohmic contact with a high-melting-point metal or an alloy of the high-melting-point metals, a low-resistance metal, or a polycrystalline or amorphous silicon with its resistance lowered by addition of suitable impurities.

The high-melting-point metal film or the high-melting-point metal alloy film below the well in which the semiconductor element is formed serves as a buried layer having a low-resistance. Since this buried layer extends into the groove of the element isolation region to thereby be connected to the conductor within the groove, electrical contact to the well can be made through the groove of the element isolation region. A diffusion region which has conventionally been necessary for making electrical contact to the well, does not exist here.

Referring to FIG. 5, the reference numeral 2 indicates a monocrystalline silicon substrate on the surface of which a silicon oxide film 4 having a thickness of 5000 to 6000 Å is formed. A tungsten film 5 having a thickness of 800 to 1000 Å is formed on the silicon oxide fim 4 and is patterned. A silicon film 14 having a thickness of 5000 to 8000 Å is formed on the silicon oxide film 4 and the tungsten film 5. The monocrystalline silicon film 14 is isolated by an element isolating groove the side surfaces of which are covered with dielectric films 30 such as silicon oxide films or silicon nitride films, a conductor 26 being buried in the groove. The conductor 26 may, for example, be polycrystalline silicon having its resistance lowered by addition of impurities. The tungsten film 5 extends into the element isolating groove to be in contact with the conductor 26.

A source 34 and a drain 36 are formed by means of impurity diffusion in the monocrystalline silicon film 14 isolated by the groove. If the monocrystalline silicon film 14 is of the P-type, the source 34 and the drain 36 are of the $N^+$-type. If the monocrystalline silicon film 14 is of the N-type, the source 34 and the drain 36 are of the $P^+$-type. A gate electrode 40 is formed in the channel region through a gate oxide film 38. The reference numeral 42 indicates an inter-layer insulating film, and the reference numeral 44 a metal wiring of Al, Al-Si or the like. The conductor 26 in the groove is also connected to a metal wiring 44.

Next, a manufacturing method for the semiconductor device shown in FIG. 5 will be described.

The process for forming a monocrystalline silicon film 14 is the same as that shown in FIG. 3(A).

That region of the monocrystalline silicon film 14 where a groove serving as the isolation region is to be formed is etched by means of RIE (Reactive Ion Etching) to form a groove. Formed on the inner walls of the groove as well as on the monocrystalline silicon film 14 is a dielectric film 30 such as a silicon oxide film or a silicon nitride film. The dielectric film which is in the region for element formation is removed afterwards. If an oxide film is formed on the tungsten film 5, it is removed by RIE etching or the like which is performed for the purpose of removing the dielectric film in the region for element formation.

After the isolating groove is filled up with polycrystalline silicon containing or not containing impurities, impurities are deposited and diffused, or are injected into the polycrystalline silicon which does not contain impurities. This causes the tungsten film 5 and the low-resistance polycrystalline silicon 26 to be connected to each other in the groove.

Afterwards, a semiconductor element is formed on the monocrystalline silicon film 14 in accordance with the usual LSI process. Then, a contact is formed on top of the polycrystalline silicon 26 buried in the isolating groove, thereby making it possible to electrically connect to the monocrystalline silicon 14.

In the embodiment shown in FIG. 6, a tungsten film 5-1 serving as a first high-melting-point metal film is formed on a silicon oxide film 4-1. A silicon oxide film 4-2 is formed and patterned on the tungsten film 5-1. Formed and patterned on the silicon oxide film 4-2 is a tungsten film 5-2 serving as a second high-melting-point metal film.

The reference numerals 14-1 and 14-2 indicate monocrystalline silicon films which are isolated from each other by element isolating grooves. Impurities are introduced into the monocrystalline silicon film regions 14-1 and 14-2, the former being of the N-type and the latter of the P-type.

A source 34P and a drain 36P are formed in each of the monocrystalline silicon film regions 14-1 by virtue of the $P^{30}$-type diffusion region. Formed in each of the monocrystalline silicon film regions 14-2 are a source 34n and a drain 36n by virtue of the $N^+$-type diffusion region. A gate electrode 40 is formed on each of the channel regions. Formed in the regions 14-1 are P-channel MOS transistors and, in the regions 14-2, N-channel MOS transistors.

The monocrystalline silicon film regions 14-1, 14-1 are connected to each other by the tungsten film 5-1, and are respectively connected to a power source terminal of, for example, +5 V through the polycrystalline silicon 26-1 which contains impurities and is disposed in a corresponding element isolating groove. On the other hand, each of the monocrystalline silicon film regions 14-2 is connected to a ground terminal through the tungsten film 5-2 and the polycrystalline silicon 26-2 which contains impurities and is disposed in a corresponding element isolating groove.

As in the embodiment shown in FIG. 6, the high-melting-point metal films or the high-melting-point metal alloy films 5-1 and 5-2 respectively disposed below the monocrystalline silicon film regions 14-1 and 14-2 are formed as a two-layer structure in which the dielectric film 4-2 intervenes between the metal films 5-1 and 5-2 or the metal alloy films 5-1 and 5-2, whereby electrical contacts can be made to separated wells which should be at the same potential.

In the embodiment shown in FIG. 7, a tungsten film, for example, is deposited as the high-melting-point metal film on the silicon oxide film 4 provided in the monocrystalline silicon substrate 2, and is patterned as indicated by the reference numerals 5-3, 5-4 and 5—5. The monocrystalline silicon film formed on top of the tungsten films 5-3, 5-4, 5—5 is isolated into active area 14-3, 14-4 and 14-5, by means of LOCOS (Local Oxidation of Silicon) isolation and grooving isolation. The reference numeral 46 indicates a field oxide film for LOCOS isolation. The reference numerals 26-3, 26-4 and 26-5 indicate polycrystalline silicon which is buried in the grooves for grooving isolation and whose resistance is lowered by adding impurities thereto. The polycrystalline silicon portions are connected in the respective grooves for isolation to the tungsten films 5-3, 5-4 and 5—5, respectively.

A desired element is formed by means of MOS process in each of the active area 14-3, 14-4 and 14-5 which are defined by isolation. The embodiment shown in FIG. 7 further includes sources 34-3, 34-4 and 34-5, drains 36-3, 36-4 and 36-5, gate electrodes 40, inter-layer insulating films 42, and a metal wiring 44.

The elements formed in the respective field active area 14-3, 14-4 and 14-5 allow electrical contact to be made to the respective polycrystalline silicon portions 26-3, 26-4 and 26-5 through the respective tungsten films 5-3, 5-4 and 5—5. Accordingly, if, for example, three types of transistors are made, separate substrate potentials can be set in conformity with the respective transistors. If, for example, the three transistors are a memory transistor, an N-channel MOS transistor and a P-channel MOS transistor, substrate potentials which are optimum for the respective transistors can be set, thus making it possible to establish the optimum conditions on individual transistors. Thus, by separately setting the substrate potentials of the respective elements, a flexible circuit construction can be attained.

In the embodiment shown in FIG. 7, both the LOCOS and grooving isolation methods are applied to the isolation regions, but it is also possible to adopt the grooving method only, as in the embodiments shown in FIGS. 5 and 6.

While, in the above embodiments, a monocrystalline silicon substrate is used as the substrate 2, it is also possible to employ a dielectric substrate such as ceramic and to deposit a dielectric film such as a silicon oxide film on the surface of the dielectric substrate by means of the CVD method or the like.

The embodiments shown in FIGS. 5 to 7 allow the element isolating regions to be used for the purpose of making electrical contact to the well.

Accordingly, in accordance with these embodiments, there is no necessity for providing diffusion regions for making contact with the wells, which makes it possible to realize a high-density structure of the semiconductor devices.

Furthermore, since the circuit pattern is simplified, circuit design is facilitated. FIG. 8 shows a conventional semiconductor device having a structure called OST (see Japanese Patent Publication No. 62-40858). "OST construction" means a structure of transistor surrounded by oxide compound film (or substrate).

The conventional device shown in FIG. 8 includes a silicon substrate 80, a field oxide film 81, an $N^+$-type type buried layer 82, an $N^-$-type epitaxial layer 83, a base 84, an emitter 85 and a collector contact 86.

To diminish the junction capacity and the parasitic capacity in the isolation portions isolating the transistors from each other, a groove extending through the buried layer 82 is formed in each isolation portion. The surface of the groove is covered with a silicon oxide film 87, the groove being filled up with polycrystalline silicon 88. The reference numeral 89 indicates a $P^+$-type channel cut. Since the transistor shown in FIG. 8 adopts $N^+$-type diffusion regions as the buried layer 82, a junction capacity exists between the buried layer 82 and the silicon substate 80.

Figure 9:
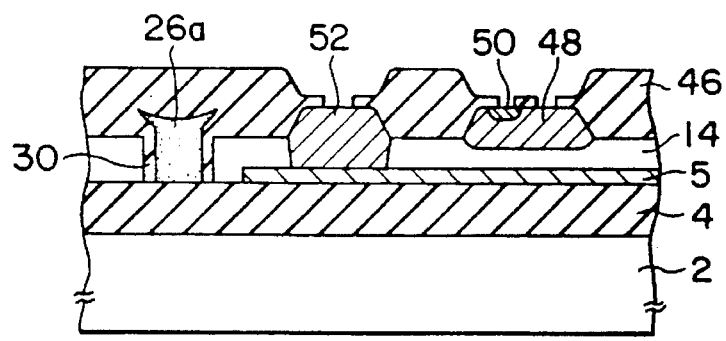
FIGS. 9 and 10 are sectional views showing the still other embodiments of the semiconductor device to which the present invention is applied.
Figure 10:
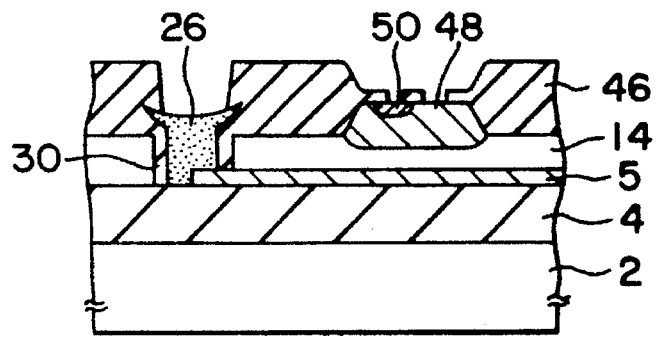
Figure 11A:
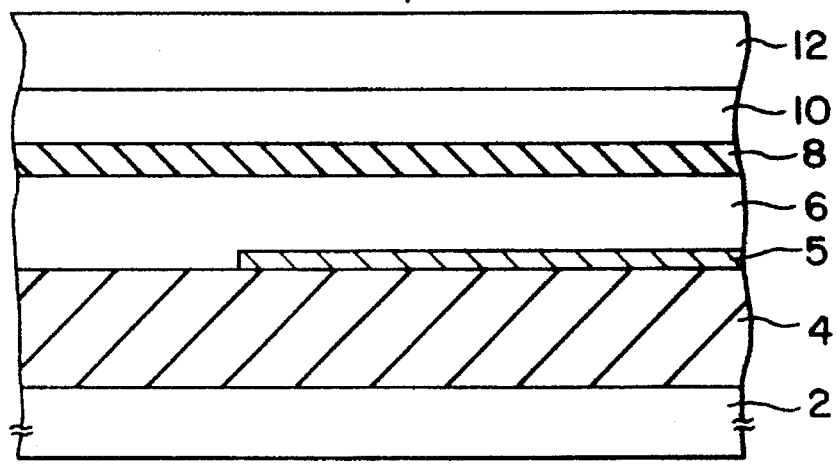
FIGS. 11(A) to 11(E) are sectional views illustrating the method of manufacturing the semiconductor device in the embodiment shown in FIG. 9.
Figure 11B:
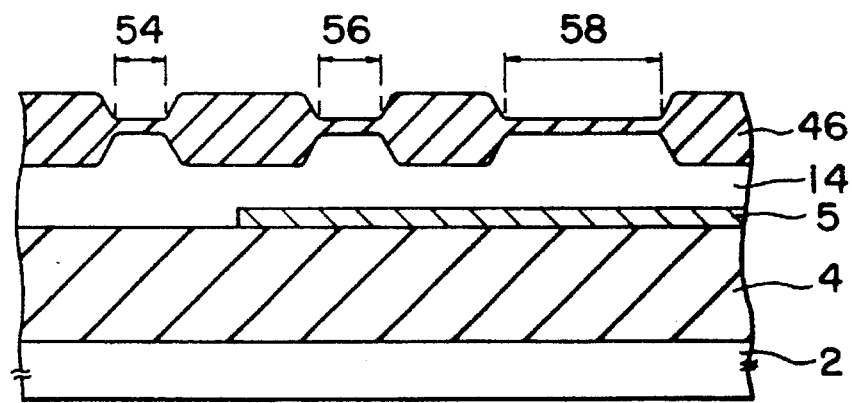
Figure 11C:
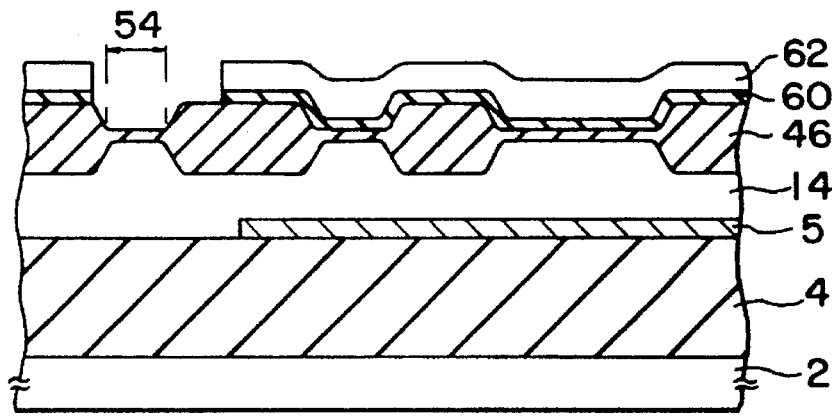
Figure 11D:
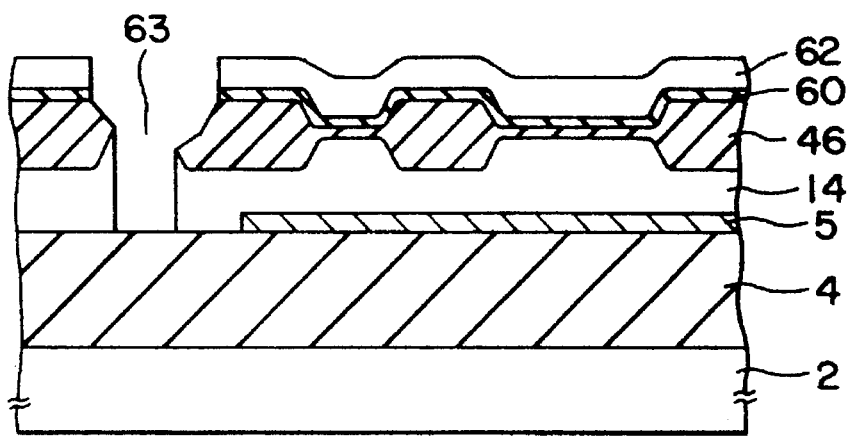
Figure 11E:
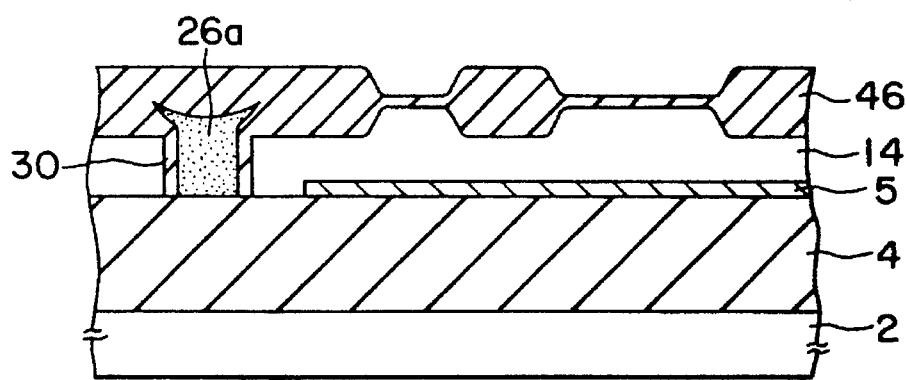

In FIGS. 9 and 10, there are shown embodiments in which the present invention is applied to a conventional-type semiconductor device such as a solid state structure in order to provide a semiconductor device having a high switching speed. Such semiconductor device improved in switching speed is attained by employing as the buried layer a high-melting-point metal film (including a high-melting-point metal alloy such as a high-melting-point metal silicide) to further diminish the junction capacity and the parasitic capacity. In both drawings, the metal wiring, passivation films, etc. are omitted.

In the embodiment shown in FIG. 9, a silicon oxide film 4 having a thickness of about 1 μm is formed on a silicon substrate 2. A tungsten film 5 which serves as the high-melting-point metal film and which has a thickness of 800 to 1000 Å is formed and patterned on the silicon oxide film 4. A monocrystalline silicon film 14 having a thickness of about 5000 Å is formed on the tungsten film 5. Formed on the monocrystalline silicon film 14 are transistors each equipped with a base 48, an emitter 50 and a collector contact 52 utilizing the monocrystalline silicon film 14 as the collector.

Formed in each of the isolation portions is a groove reaching the silicon oxide film 4. The surface of the groove is covered with a silicon oxide film 30, the groove being filled up with polycrystalline silicon 26a not doped with impurities.

Each collector contact 52 is in contact with the tungsten film 5 which constitutes a buried layer.

Unlike the embodiment shown in FIG. 9, the embodiment shown in FIG. 10 includes no collector contacts 52, the tungsten film 5 constituting the buried layer being exposed inside the groove in each isolation portion. The polycrystalline silicon 26 with which fills up the groove in the isolation portion is a polycrystalline silicon whose the resistance is lowered by doping it with impurities. Contact holes are provided over the polycrystalline silicon 26. The contact of the tungsten film 5 with the polycrystalline silicon 26 makes it possible to effect collector contact in the isolation portion.

In the embodiment shown in FIG. 10, the requisite area for each transistor becomes small, thereby making it possible to increase the degree of integration.

The method of manufacturing the semiconductor device shown in FIG. 9 will now be described on reference to FIG. 11 (A) to FIG. 11 (E).

FIG. 11 (A) The method illustrated in FIG. 3 (A) is adopted in forming a monocrystalline silicon film on an insulator.

FIG. 11 (B) Next, regions 54 where the isolating portions are to be formed, regions 56 where the collector contacts are to be formed and regions 58 where the bases are to be formed are respectively masked with silicon nitride films, and thereafter a field oxide film 46 having a thickness of 1 to 1.5 μm is formed by means of selective oxidation.

FIG. 11 (C) Subsequently, a silicon nitride film 60 having a thickness of 0.1 to 0.2 μm is formed over the entire surface of the field oxide film 46 by means of the CVD method, and a PSG (Phosphorus Silicate Glass) film 62 having a thickness of 0.5 μm or so is formed on the silicon nitride film 60.

By means of photomechanical process and etching there are removed the silicon nitride film 60 and the PSG film 62 existing in the regions 54 where the isolation portions are to be formed, to thereby form openings.

FIG. 11 (D) Next, the regions 54 where the isolation sections are to be formed are etched through the respective openings by means of the RIE method using ($CCl_4$ + $BCl_3$) gas, thereby forming grooves 63 reaching the silicon oxide film 4.

Afterwards, the PSG film 62 is removed by means of wet etching.

FIG. 11 (E) Then, a silicon oxide film 30 is formed by selectively oxidizing the surface of each groove 63, and polycrystalline silicon 26a which is not doped with impurities is grown in each groove 63, so that each groove 63 is filled up with the polycrystalline silicon 26a. Materials other than polycrystalline silicon, for example, insulators such as $SiO_2$ and $Si_3N_4$ or polymeric materials, may be employed for filling up the grooves.

The surface of the polycrystalline silicon 26a is selectively oxidized using the silicon nitride film 60, thereby covering the surface of the polycrystalline silicon 26a. The silicon oxide film formed at that time is connected to the field oxide film 46. Afterwards, the silicon nitride film 60 is removed.

After that, bases, emitters and collector contacts are formed in accordance with the conventional bipolar process.

In the case of manufacturing the semiconductor device shown in FIG. 10, the regions 56 where the collector contacts are to be formed are not provided. Instead, patterning is so effected that the tungsten film 5 extends into the regions 54 where the isolation regions are to be formed. To lower the resistance of the polycrystalline silicon 26 with which the grooves in the isolation regions are filled up, phosphorous is diffused in the polycrystalline silicon. In order to use the polycrystalline silicon 26 as the collector contacts, contact holes are provided in the silicon oxide film situated above the polycrystalline silicon 26.

In the semiconductor devices of the OST structure shown in FIGS. 9 and 10, the isolation regions are formed as insulated grooves, and a high-melting-point metal film is employed as the buried layer, so that the junction capacity and the parastic capacity can be further diminished, and the switching speed of the semiconductor device can be increased.

What is claimed is:

1. A solid state structure comprising:

a foundation made of a dielectric material;

a first metal film made of an electrically conductive metal and disposed on said foundation;

a monocrystalline semiconductor film disposed on said first metal film;

a plurality of grooves formed in said monocrystalline semiconductor film so as to divide said monocrystalline semiconductor film into islands which are laterally spaced apart from each other and to reach an upper surface of said first metal film;

a plurality of first dielectric films disposed at bottoms of some of said islands such that said first dielectric films are spaced apart from each other, each of said first dielectric films overlying an upper surface of said first metal film, and extending and projecting into adjacent islands;

a plurality of second metal films each disposed on one of said first dielectric films in such a manner as to be sandwiched between said one of said first dielectric films and a selected island corresponding to each of said some of said islands, each of said second metal films extending and projecting into grooves defining said selected island;

second dielectric films disposed on side walls of respective islands defining said grooves so that said islands are electrically isolated from each other; and a conductor material buried in each of grooves defined by said second dielectric films so that said selected island can be electrically connected to an outside of said structure through one of said second metal films, and islands other than said selected island can be electrically connected to the outside of said structure through said first metal film.

2. A solid state structure according to claim 1, in which said selected island includes an active device, and said one of said second metal films serves as an electrode for making electrical contact to said active device in said selected island.

3. A solid state structure according to claim 1, in which an island which is laterally spaced apart from said selected island comprises MOS device of a first type formed therein, and said selected island comprises MOS device of a complementary type, said structure comprising a CMOS IC.

* * * * *